US007951666B2

(12) United States Patent
Ho et al.

(10) Patent No.: US 7,951,666 B2
(45) Date of Patent: May 31, 2011

(54) DEEP TRENCH CAPACITOR AND METHOD

(75) Inventors: Herbert L. Ho, New Windsor, NY (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 699 days.

(21) Appl. No.: 11/872,970

(22) Filed: Oct. 16, 2007

(65) Prior Publication Data

US 2009/0095998 A1 Apr. 16, 2009

(51) Int. Cl.
*H01L 21/8242* (2006.01)

(52) U.S. Cl. ........................................ 438/246; 257/296

(58) Field of Classification Search .................. 257/296, 257/301–305, 300; 438/668, 672, 700, 243, 438/246, 386

See application file for complete search history.

(56) References Cited

U.S. PATENT DOCUMENTS 5,045,904 A * 9/1991 Kobayashi et al. ........... 257/304
5,885,863 A 3/1999 Yoshida
6,507,511 B1 1/2003 Barth, Jr. et al.
6,964,897 B2 11/2005 Bard et al.
6,984,860 B2 * 1/2006 Grivna et al. ................ 257/301
2005/0176197 A1 8/2005 Weis et al.
2005/0263850 A1 12/2005 Aitken et al.
2006/0163636 A1 7/2006 Cheng et al.
2006/0226474 A1 10/2006 Ho et al.

* cited by examiner

*Primary Examiner* — Steven Loke
*Assistant Examiner* — Kimberly M Thomas
(74) *Attorney, Agent, or Firm* — Gibb I.P. Law Firm, LLC

(57) ABSTRACT

Disclosed herein are embodiments of a deep trench capacitor structure and a method of forming the structure that incorporates a buried capacitor plate contact that is simultaneously formed using an adjacent deep trench. This configuration eliminates the need for additional photolithographic processing, thereby, optimizing process windows. This configuration further eliminates the need to form the deep trench capacitor through an N-doped diffusion region connector and, thereby, allows for greater design flexibility when connecting the deep trench capacitor to another integrated circuit structure (e.g., a memory cell or decoupling capacitor array). Also, disclosed herein are embodiments of another integrated circuit structure and method, and more specifically, a memory cell (e.g., a static random access memory (SRAM) cell)) and method of forming the memory cell that incorporates one or more of these deep trench capacitors in order to minimize or eliminate soft errors.

12 Claims, 19 Drawing Sheets

600
610
606
611
1650
1450
605
625
613
609
663
604
652
651
624
603
623
601
633
621
602
605

DEEP TRENCH CAPACITOR AND METHOD

BACKGROUND

1. Field of the Invention

The embodiments of the invention generally relate to deep trench capacitors, and, more particularly, to a deep trench capacitor structure having a buried capacitor plate contact simultaneously formed using second deep trench.

2. Description of the Related Art

Deep trench capacitors are often used to add capacitance to various types of integrated circuit devices and structures, including but not limited to memory cells and decoupling capacitor arrays. For example, as disclosed in U.S. Pat. No. 6,507,511, which was issued to Barth et al. on Jan. 14, 2003 and which is incorporated herein by reference in its entirety, deep trench capacitors can be used to add capacitance to the storage nodes of static random access memory (SRAM) cells and other types of memory cells in order to increase $Q_{crit}$ and eliminate soft errors. Soft errors occur due the movement of alpha particles, which can introduce a charge into a memory cell circuit. Such a charge can cause the logic state of the cell to inadvertently change. Added capacitance to the storage nodes of memory cells reduces their susceptibility to soft errors, by providing increased stability (i.e., by increasing the charge required for the logic state of the memory cell to change). Additionally, as circuits scale for higher speed, larger transient switching noise is generated and more on-chip decoupling capacitance is required. Conventional planar oxide capacitors require more space than desireable; therefore, deep trench capacitors are used to provide the capacitance requirements and the chip size requirements simultaneously.

A typical deep trench capacitor comprises a deep trench in a semiconductor substrate (e.g., the semiconductor substrate of either a bulk silicon wafer or silicon-on-insulator (SOI) wafer). A doped region within in the substrate adjacent to the trench forms one capacitor plate (i.e., a buried capacitor plate). A dielectric layer lining the trench forms the capacitor dielectric. Finally, a conductive fill material (e.g., a doped polysilicon) within the trench forms another capacitor plate. A standard contact can be formed to capacitor plate within the trench. However, a number of additional processing steps are required to form the buried capacitor plate contact.

For example, if a bulk silicon wafer is used, then the deep trench capacitor must be formed such that it extends through an N-doped diffusion connector (e.g., an NWELL) in the silicon substrate. Next, a feature is patterned in the NWELL at the top surface of the silicon substrate and a contact is formed to this patterned silicon feature. Similarly, if a silicon-on-insulator (SOI) wafer is used, then the deep trench capacitor must be formed such that it extends through an N-doped diffusion connector (e.g., an NBAND) below the buried oxide (BOX) layer. Next, a patterned doped polysilicon feature is formed that extends through the BOX layer to the NBAND and a contact is formed to this polysilicon feature.

In either case, due to the requirement of an N-doped diffusion connector, circuit design flexibility is sacrificed. Furthermore, in either case photolithographic techniques must be used to pattern a feature to the N-doped diffusion connector. Consequently, the ground rules for these additional processing steps must take into account overlay tolerances between the contact structures and the deep trench capacitor itself, critical dimension tolerances, the minimum allowable distance between the buried trench and the boundary of the n-doped diffusion connector, etc. Consequently, process windows are small and the sizes of the various circuits that incorporate such deep trench capacitors (e.g., SRAM cells) are not optimized.

SUMMARY

In view of the foregoing, disclosed herein are embodiments of a deep trench capacitor structure and a method of forming the structure that incorporates a buried capacitor plate contact that is simultaneously formed using an adjacent deep trench. The disclosed configuration eliminates the need for additional photolithographic processing, thereby, optimizing process windows. Additionally, the disclosed configuration eliminates the need to form the deep trench capacitor through an N-doped diffusion region connector and, thereby, allows for greater design flexibility when connecting the deep trench capacitor to another integrated circuit structure (e.g., to a memory cell or a decoupling capacitor array).

More particularly, disclosed herein are embodiments of a deep trench capacitor structure. The deep trench capacitor structure comprises a semiconductor substrate (e.g., the semiconductor substrate of a bulk semiconductor wafer, the silicon substrate of a bulk silicon wafer, the silicon substrate of a silicon-on-insulator (SOI) wafer, etc.). The deep trench capacitor structure can further comprise a first trench and a second separate, non-overlapping adjacent trench in the semiconductor substrate.

Specifically, the first trench can extend vertically from the top surface towards the bottom surface of the semiconductor substrate. A first doped region (i.e., a buried capacitor plate) within the semiconductor substrate can border the first trench. Specifically, the first doped region can be adjacent the bottom surface and sidewalls of the first trench (i.e., adjacent to the first bottom surface and first sidewalls). Additionally, the bottom surface and sidewalls of the first trench can be lined with a dielectric liner (i.e., a capacitor dielectric layer). A conductive fill material, such as a doped polysilicon fill material, can fill the remainder of the first trench and can, thereby, function as another capacitor plate. A first contact can be positioned adjacent to the conductive fill material within the first trench (i.e., adjacent to capacitor plate within the first trench).

The second trench can similarly extend vertically from the top surface towards the bottom surface of the semiconductor substrate. A second doped region within the semiconductor substrate can border the second trench. Specifically, the second doped region can be adjacent the bottom surface and sidewalls of the second trench (i.e., adjacent to the second bottom surface and second sidewalls). This second doped region can further be in contact with the first doped region. A conductive fill material, such as a doped polysilicon fill material, can also fill the second trench. While a portion of the second trench can be lined with a dielectric liner (e.g., the same dielectric liner as in the first trench) at least the upper section of the second trench (i.e., the upper sidewalls) remain unlined so that the conductive fill material in the second trench is in contact with the second doped region of the semiconductor substrate. A second contact can be positioned adjacent to the conductive fill material within the second trench.

The doped regions of the structure (including the first and second doped regions within the substrate and any doped fill material in the first and second trenches) can be heavily doped with the same type dopant (e.g., an N-type dopant or a P-type dopant) such that they are conductive. The conductive fill material within the second trench and the second doped region within the semiconductor substrate provide the electrical connection between the second contact and the first doped region (i.e., between the second contact and the buried capacitor plate). Consequently, the deep trench capacitor structure of the present invention includes a unique deep trench buried capacitor plate contact comprising the second contact, the conductive fill material in the second trench and the second doped region within the substrate.

Also disclosed are embodiments of a method of forming the above-described deep trench capacitor structure. The method comprises first providing a semiconductor substrate (e.g., the silicon substrate of a silicon-on-insulator (SOI) wafer, the semiconductor substrate of a bulk semiconductor wafer, the silicon substrate of a bulk silicon wafer, etc.). Conventional deep trench processing techniques can be used to form two adjacent deep trenches in the semiconductor substrate (i.e., a first trench and a second trench), where each trench extends vertically from the top surface towards the bottom surface of the semiconductor substrate.

Once the trenches are formed, regions of the semiconductor substrate adjacent to each of the trenches are heavily doped with the same type dopant (e.g., an N-type or a P-type dopant) such that these regions are conductive. Specifically, this process comprises simultaneously forming, in the semiconductor substrate, a first doped region adjacent to the bottom surface and sidewalls of the first trench (i.e., adjacent to the first bottom surface and first sidewalls) and a second doped region adjacent the bottom surface and sidewalls of the second trench (i.e., adjacent to the second bottom surface and second sidewalls). Furthermore, this process is performed such that the first doped region and second doped region contact each other (e.g., overlap).

Next, a dielectric liner can be formed within the first trench adjacent to the bottom surface and the sidewalls (e.g., by depositing a thin conformal dielectric layer). Then, the trenches can be filled with a conductive fill material (e.g., by depositing a doped polysilicon material) such that the conductive fill material in the second trench is in contact with the second doped region in the semiconductor substrate. Specifically, after the first and second doped regions are formed in the semiconductor substrate, a thin conformal dielectric layer is deposited across the structure such that it covers the bottom surface and sidewalls of the first trench as well as the bottom surface and sidewalls of the second trench. Then, a blanket layer of a conductive fill material (e.g., a polysilicon material doped with the same N-type or P-type dopant as the first and second doped regions) can be deposited and planarized, stopping at the top of the trench. Once both trenches are filled, the first trench can be masked and the conductive fill material as well as the thin conformal dielectric layer in the second trench can be recessed so as to expose at least an upper section of the trench. Next, the mask over the first trench can be removed and the conductive fill material can be redeposited and planarized. Thus, the conductive fill material in the upper section of the second trench is in contact with the second doped region of the semiconductor substrate.

Once the trenches are filled with the conductive fill material, conventional processing techniques can be used to form contacts. That is, first and second contacts can simultaneously be formed to the conductive fill material in the first and second trenches, respectively. In the resulting structure, the first doped region adjacent to the first trench functions as the buried capacitor plate, the dielectric liner lining the first trench functions as the capacitor dielectric and the conductive fill material in the first trench functions as another capacitor plate. Thus, the first contact directly contacts the capacitor plate within the first trench and the second doped region as well as the conductive fill material in the second trench in contact with that second doped region provides the electrical connection between the second contact and the buried capacitor plate. Consequently, the deep trench capacitor that is formed using this method includes a unique deep trench buried capacitor plate contact comprising the second contact, the conductive fill material in the second trench and the second doped region within the substrate.

Also disclosed are embodiments of another integrated circuit structure and, more specifically, a memory cell (e.g., a static random access memory (SRAM) cell) that incorporates the above-described deep trench capacitor structure including the deep trench buried capacitor plate contact. As discussed above, soft errors can be eliminated or at least minimized by adding a deep trench capacitor to a memory cell structure. Specifically, the memory cell structure comprises a semiconductor substrate (e.g., the silicon substrate of a silicon-on-insulator (SOI) wafer, the semiconductor substrate of a bulk semiconductor wafer, the silicon substrate of a bulk silicon wafer, etc.). The memory cell structure further comprises a pair of inverter circuits posited either within the substrate (e.g., within a bulk semiconductor substrate) or above the substrate (e.g., in a silicon layer above a buried oxide (BOX) layer of an SOI wafer). The pair of inverter circuits can be electrically connected by a cross-coupled connection. At least one deep trench capacitor (as described in detail above) is positioned within the semiconductor substrate and is electrically connected by the second contact and, more specifically, by the deep trench buried capacitor plate contact, to the cross-coupled connection Also disclosed are embodiments of a method of forming the above-described memory cell. Again, the memory cell structure comprises first providing a semiconductor substrate (e.g., the silicon substrate of a silicon-on-insulator (SOI) wafer, the semiconductor substrate of a bulk semiconductor wafer, the silicon substrate of a bulk silicon wafer, etc.). One or more deep trench capacitors, each having a deep trench buried capacitor plate, are formed within the semiconductor substrate (see detailed discussion above regarding the method steps for forming such a deep trench capacitor). Then, a conventional memory cell structure, such as an static random access memory (SRAM) memory cell structure, that comprises at least a pair of cross-coupled inverter circuits is formed either within or above the semiconductor substrate. The deep trench capacitor(s) are electrically connected to the cross-coupled connection between the pair of inverter circuits by the second contact and, more particularly, by the deep trench buried capacitor plate contact.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of these embodiments without departing from the spirit thereof, and these embodiments, therefore, include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
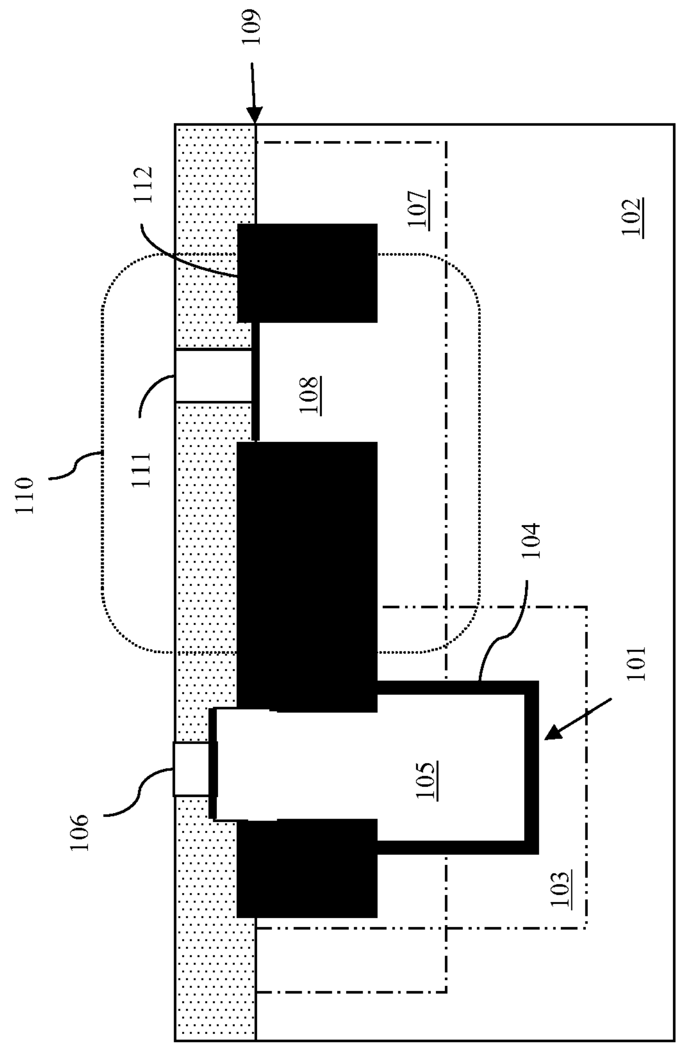
FIG. 1 is a cross-section view diagram illustrating an exemplary deep trench capacitor formed in the semiconductor substrate of a bulk semiconductor wafer.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Deep trench capacitors are often used to add capacitance to various types of integrated circuit devices, including but not limited to memory cells and decoupling capacitor arrays. For example, as disclosed in U.S. Pat. No. 6,507,511, which was issued to Barth et al. on Jan. 14, 2003 and which is incorporated herein by reference in its entirety, deep trench capacitors can be used to add capacitance to the storage nodes of static random access memory (SRAM) cells and other types of memory cells in order to increase $Q_{crit}$ it and eliminate soft errors. Soft errors occur due the movement of alpha particles, which can introduce a charge into a memory cell circuit. Such a charge can cause the logic state of the cell to inadvertently change. Added capacitance to the storage nodes of memory cells reduces their susceptibility to soft errors, by providing increased stability (i.e., by increasing the charge required for the logic state of the memory cell to change). Additionally, as circuits scale for higher speed, larger transient switching noise is generated and more on-chip decoupling capacitance is required. Conventional planar oxide capacitors require more space than desireable, so deep trench capacitors are used to provide the capacitance requirements and the chip size requirements simultaneously.

Figure 2:
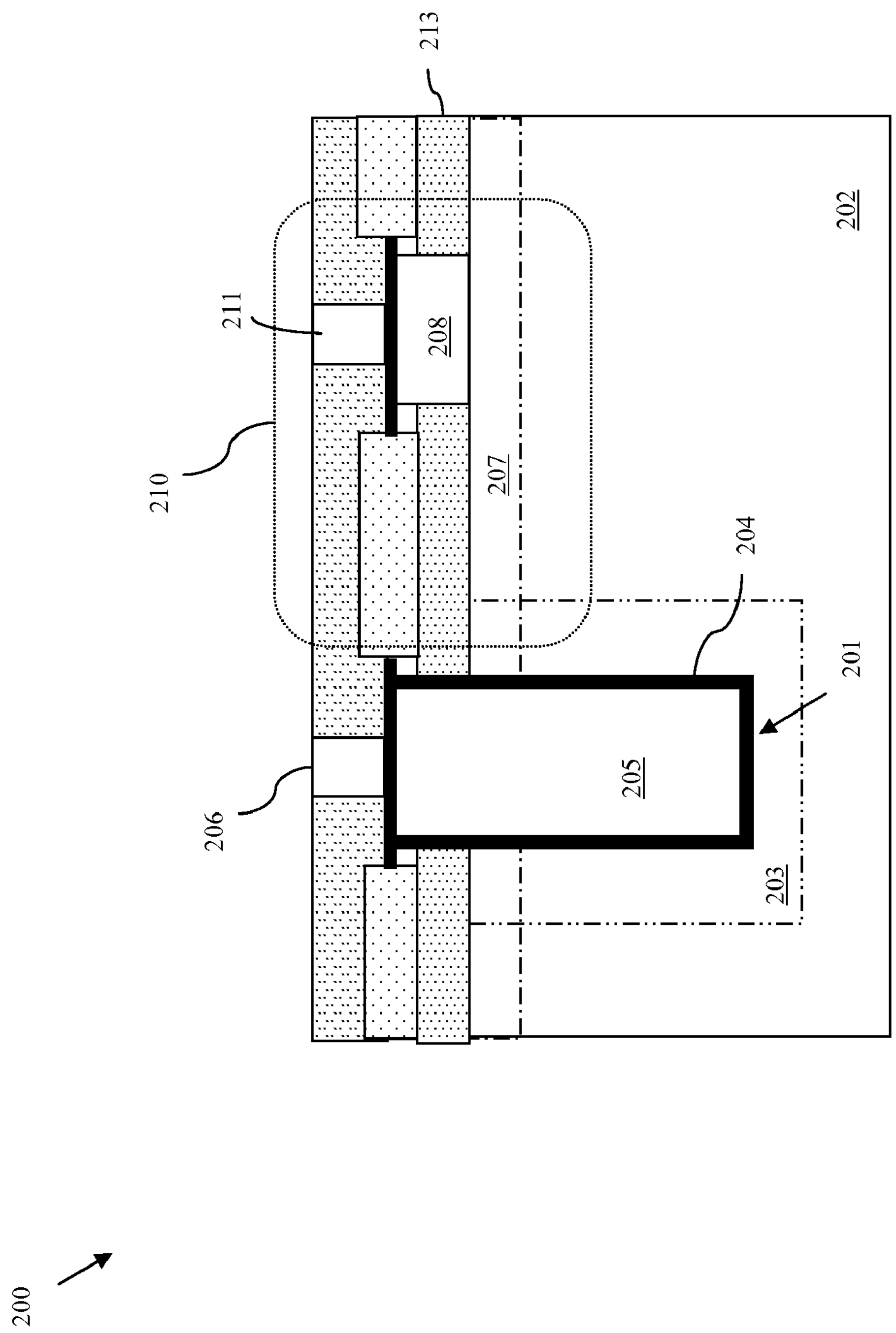
FIG. 2 is a cross-section view diagram illustrating an exemplary deep trench capacitor formed in the semiconductor substrate of a silicon-on-insulator (SOI) wafer.

FIGS. 1 and 2 provide illustrations of deep trench capacitors 100, 200 formed using a bulk semiconductor wafer and a silicon-on insulator (SOI) wafer, respectively. Each of these deep trench capacitors 100, 200 comprises a deep trench 101, 201 in a semiconductor substrate 102, 202 (e.g., the semiconductor substrate of either a bulk silicon wafer or silicon-on-insulator (SOI) wafer). A doped region 103, 203 within the substrate 102, 202 adjacent to the trench forms one capacitor plate (i.e., a buried capacitor plate). A dielectric layer 104, 204 lining the trench 101, 201 forms the capacitor dielectric. Finally, a conductive fill material 105, 205(e.g., a doped polysilicon) within the trench 101, 201 forms another capacitor plate. A standard contact 106, 206 can be formed to the capacitor plate 105, 205 within the trench. However, a number of additional processing steps are required to form the buried capacitor plate contact 110, 210.

For example, as illustrated in FIG. 1, when a bulk silicon wafer is used, then the deep trench capacitor 100 must be formed such that it extends through an N-doped diffusion connector 107 (e.g., an NWELL) in the silicon substrate 102. Next, a feature 108 is patterned in the NWELL 107 at the top surface 109 of the silicon substrate 102 and bordered by shallow trench isolation (STI) regions 112. A contact 111 is formed to this patterned silicon feature 108. Similarly, as illustrated in FIG. 2, when a silicon-on-insulator (SOI) wafer is used, then the deep trench capacitor 200 must be formed such that it extends through an N-doped diffusion connector 207 (e.g., an NBAND) below the buried oxide (BOX) layer 213. Next, a patterned doped polysilicon feature 208 is formed that extends through the BOX layer 213 to the NBAND 207. A contact 211 is formed to this polysilicon feature 208.

In either case, due to the requirement of an N-doped diffusion connector 107, 207, circuit design flexibility is sacrificed. Furthermore, in either case photolithographic techniques must be used to pattern a feature 108, 208 to the N-doped diffusion connector 107, 207. Consequently, the ground rules for these additional processing steps must take into account overlay tolerances between the contact structures and the deep trench capacitor itself, critical dimension tolerances, the minimum allowable distance between the buried trench and the boundary of the n-doped diffusion connector, etc. Consequently, process windows are small and the sizes of the various circuits that incorporate such deep trench capacitors (e.g., SRAM cells) are not optimized.

In view of the foregoing, disclosed herein are embodiments of a deep trench capacitor structure and a method of forming the structure that incorporates a buried capacitor plate contact that is simultaneously formed using an adjacent deep trench. The disclosed configuration eliminates the need for additional photolithographic processing, thereby, optimizing process windows. The disclosed configuration also eliminates the need to form the deep trench capacitor through an N-doped diffusion region connector, such as an NWELL or an NBAND, and, thereby, allows for greater design flexibility when connecting the deep trench capacitor to another integrated circuit structure (e.g., to a memory cell or decoupling capacitor array).

Figure 3:
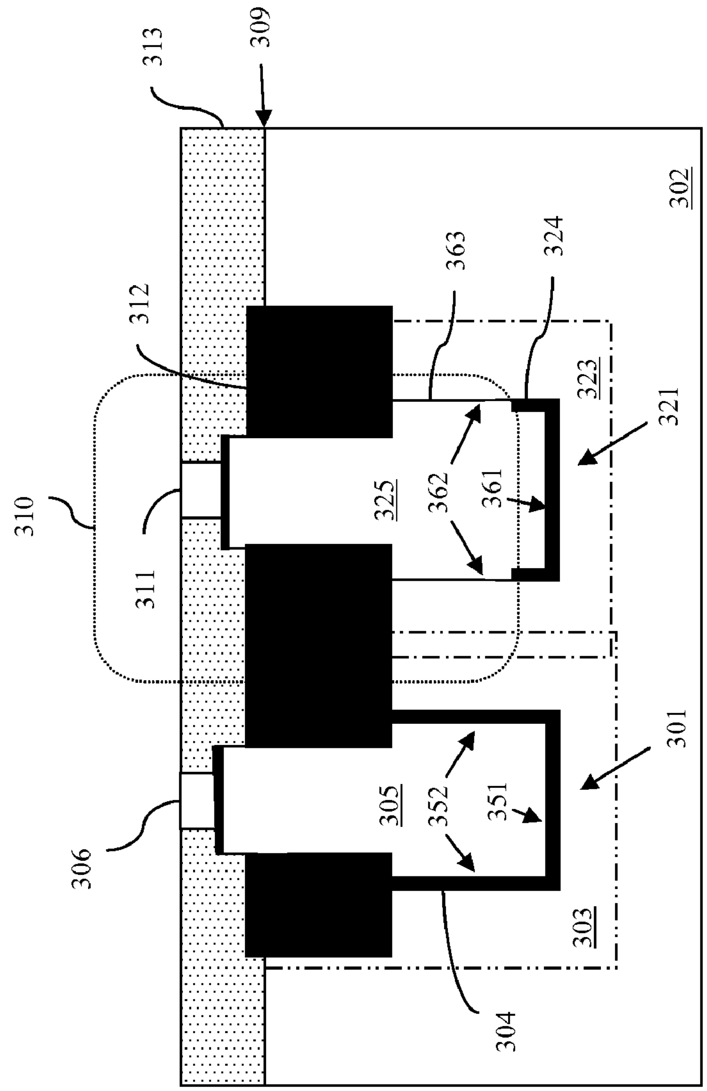
FIG. 3 is a cross-section view diagram illustrating an embodiment of a deep trench capacitor of the present invention formed in the semiconductor substrate of a bulk semiconductor wafer.
Figure 4:
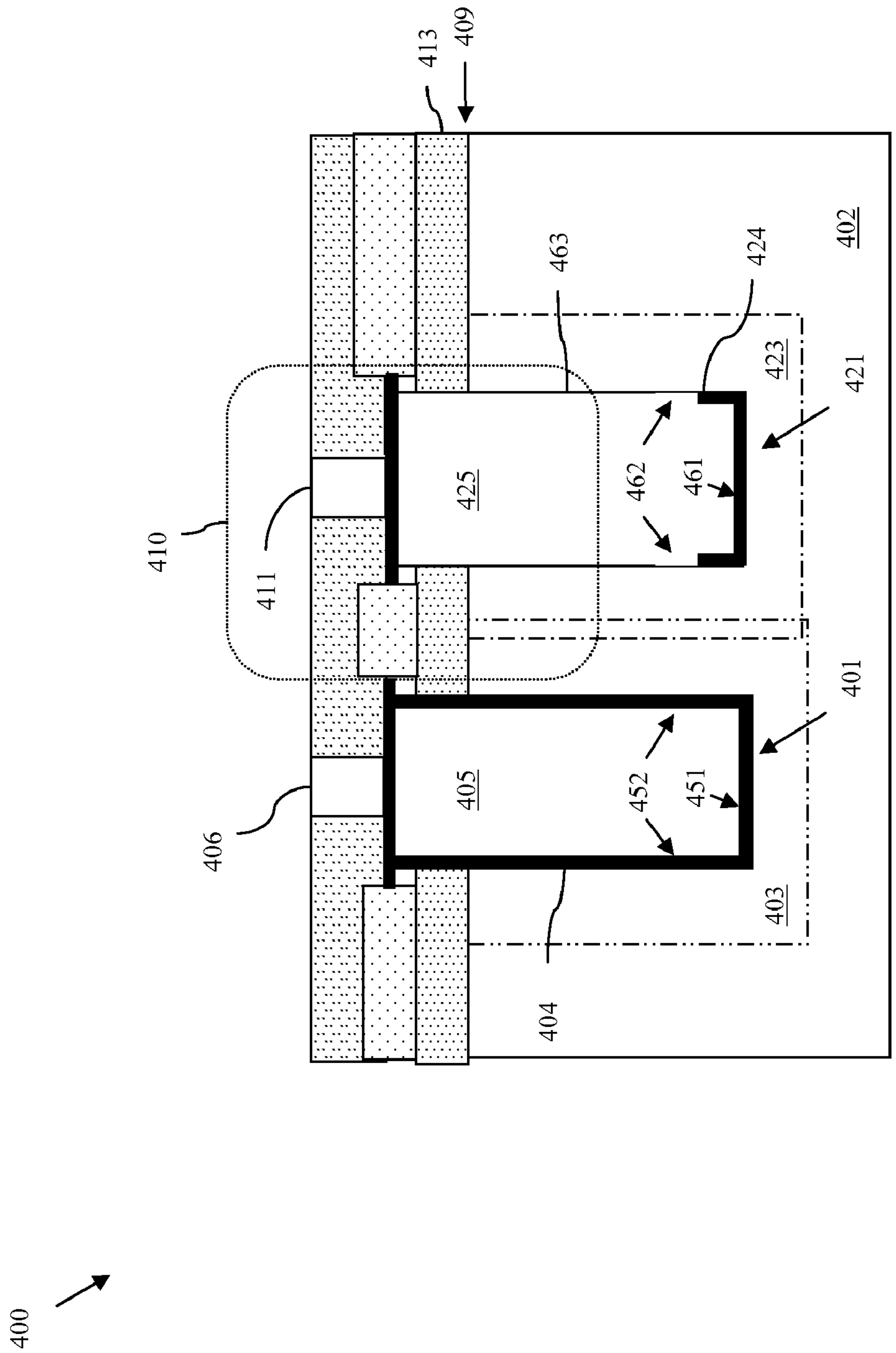
FIG. 4 is a cross-section view diagram illustrating an embodiment of a deep trench capacitor of the present invention formed in the semiconductor substrate of a silicon-on-insulator (SOI) wafer.

More particularly, FIGS. 3 and 4 illustrate embodiments of the deep trench capacitor structure 300, 400 of the present invention formed using a bulk semiconductor wafer and a silicon-on-insulator (SOI) wafer, respectively. In each of these embodiments, the deep trench capacitor structure 300, 400 comprises a semiconductor substrate 302, 402 (e.g., the semiconductor substrate of a bulk semiconductor wafer, the silicon substrate of a bulk silicon wafer, the silicon substrate of a silicon-on-insulator (SOI) wafer, etc.). The deep trench capacitor structure 300, 400 can further comprise a first trench 301, 401 and a second separate, non-overlapping adjacent trench 321,421 in the semiconductor substrate 302, 402.

Specifically, referring to both FIGS. 3 and 4, the first trench 301, 401 can extend vertically from the top surface 309, 409 towards the bottom surface of the semiconductor substrate 302, 402. A first doped region 303, 403 (i.e., a buried capacitor plate) within the semiconductor substrate 302, 402 can border the first trench 301, 401. Specifically, the first doped region 303, 403 can be adjacent the bottom surface 351, 451 and sidewalls 352, 452 of the first trench 301, 401 (i.e., adjacent to the first bottom surface and first sidewalls). Additionally, the bottom surface 351, 451 and sidewalls 352, 452 of the first trench 301, 401 can be lined with a dielectric liner 304, 404 (i.e., a capacitor dielectric layer). The dielectric liner 304, 404 can comprise any suitable dielectric material, including but not limited to silicon oxide, silicon nitride, silicon oxynitride, high-k material, and any combination of these materials. A conductive fill material 305, 405 can fill the remainder of the first trench and can, thereby, function as another capacitor plate. The conductive fill material 305, 405 can comprise a doped polycrystalline or amorphous silicon, germanium or silicon germanium. Alternatively, the conductive fill material 305, 405 can comprise a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), or any suitable combination of these materials. A first contact 306, 406 can be positioned adjacent to the conductive fill material 305, 405 within the first trench 301, 401 (i.e., adjacent to capacitor plate within the first trench).

The second trench 321, 421 can similarly extend vertically from the top surface 309, 409 towards the bottom surface of the semiconductor substrate 302, 402. A second doped region 323, 423 within the semiconductor substrate 302, 402 can border the second trench 321, 421. Specifically, the second doped region 323, 423 can be adjacent the bottom surface 361, 461 and sidewalls 362, 462 of the second trench 321, 421 (i.e., adjacent to the second bottom surface and second sidewalls). This second doped region 323, 423 can further be in contact with the first doped region 303, 403. A conductive fill material 325, 425 can also fill the second trench 321, 421. This conductive fill material 325, 425 can be the same as the conductive fill material 305, 405 that filled the first trench 301, 401 (see discussion above).

Furthermore, while a portion (e.g., the bottom surface 361, 461 of the second trench 321, 421) can be lined with a dielectric liner 324, 424 (e.g., the same dielectric liner as in the first trench 301, 401) at least the upper section 363, 463 of the second trench 321, 421 (i.e., the upper sidewalls) remain unlined so that the conductive fill material 325, 425 in the second trench 321, 421 is in contact with the second doped region 323, 423 of the semiconductor substrate 302, 402. A second contact 311, 411 can be positioned adjacent to the conductive fill material 325,425 within the second trench 321, 421.

The doped regions of the structure (including the first doped region 303, 403 within the substrate, the second doped region 323, 423 within the substrate and any doped conductive fill material in the first and second trenches) can be heavily doped with the same type dopant (e.g., the same N-type dopant or P-type dopant) such that they are conductive. For example, each of these doped region can be heavily doped with an N-type dopant, such as phosphorus (P), arsenic (As) and/or antimony (Sb)). Alternatively, each of these regions can be doped with a p-type dopant, such as boron (B), gallium (Ga), indium (In), and/or thallium (Tl). The conductive fill material 325, 425 within the second trench 321, 421 and the second doped region 323, 423 within the semiconductor substrate 302, 402 provide the electrical connection between the second contact 311, 411 and the first doped region 303, 403 (i.e., between the second contact and the buried capacitor plate). Consequently, the deep trench capacitor structure 300 of FIG. 3 or 400 of FIG. 4 includes a unique deep trench buried capacitor plate contact 310, 410 comprising the second contact 311, 411, the conductive fill material 325, 425 in the second trench 321, 421 and the second doped region 323, 423 within the semiconductor substrate 302, 402.

Figure 5:
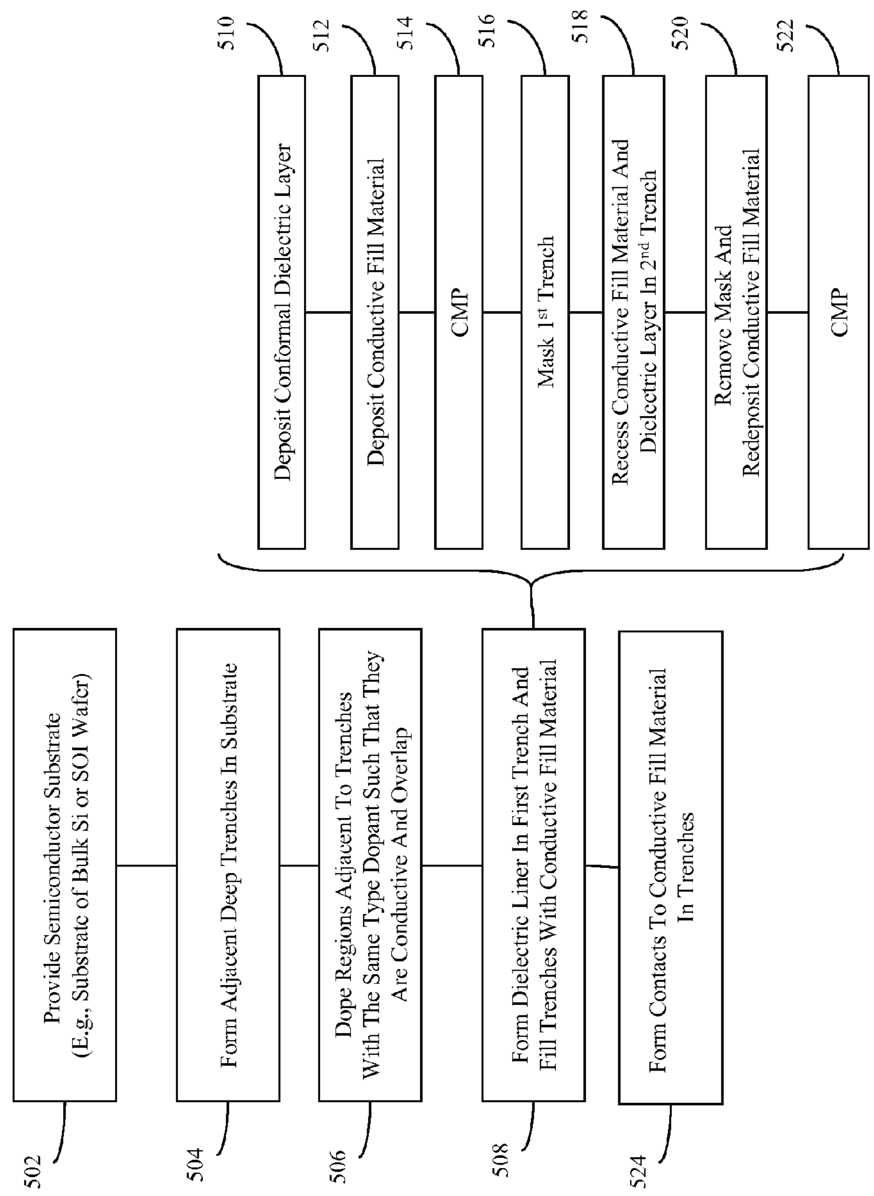
FIG. 5 is a flow diagram illustrating embodiments of a method of forming the deep trench capacitors of FIGS. 3 and 4.
Figure 6:
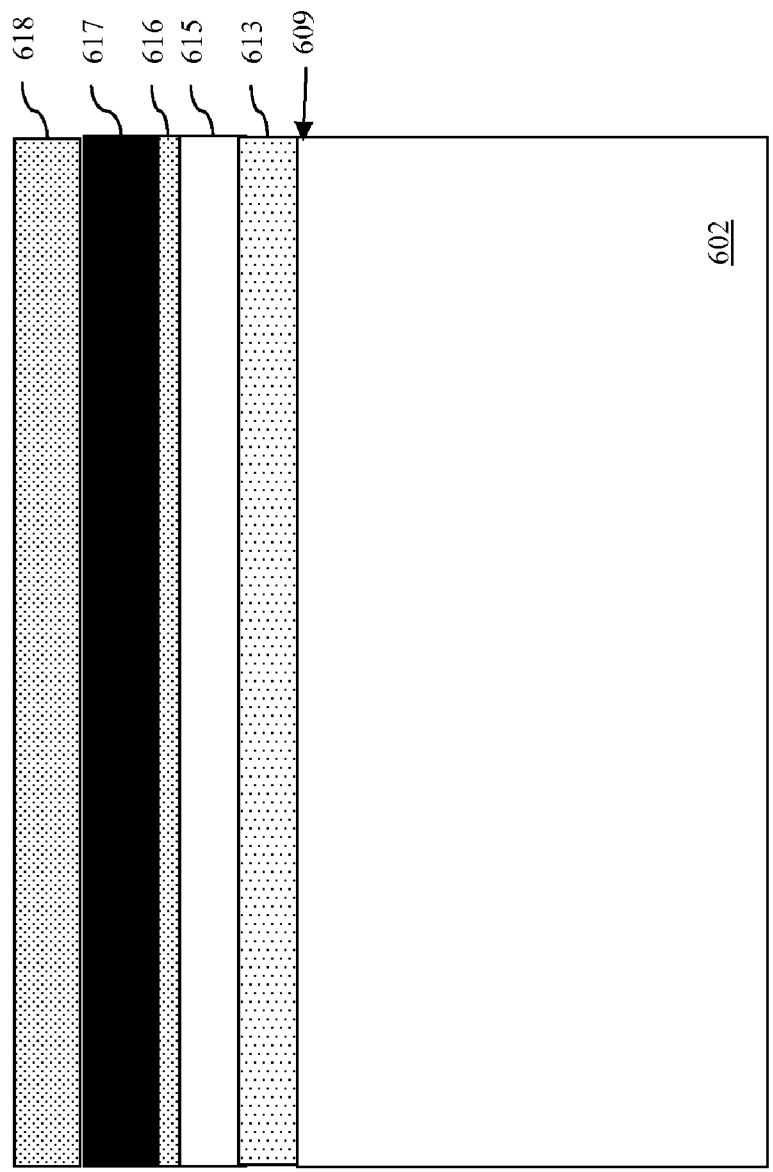
FIG. 6 is a cross-section view diagram illustrating a partially completed deep trench capacitor structure.

Referring to FIG. 5, also disclosed are embodiments of a method of forming the above-described deep trench capacitor structures 300 of FIG. 3 and 400 of FIG. 4. The method comprises first providing a semiconductor substrate (e.g., the silicon substrate of a silicon-on-insulator (SOI) wafer, the semiconductor substrate of a bulk semiconductor wafer, the silicon substrate of a bulk silicon wafer, etc.) (502).

For purposes of illustration, the method steps of FIG. 5 are illustrated in FIGS. 6-16, using a silicon-on-insulator (SOI) wafer. The SOI wafer can comprise a silicon layer 615 on a buried oxide layer 613 above a silicon substrate 602 (see FIG. 6). Additional processing steps performed on the SOI wafer can include, but are not limited to, the formation of a pad oxide layer 616 on the silicon layer 616, a nitride layer 617 on the pad oxide layer 616, and a hard mask layer 618 (e.g., another oxide layer) on the nitride layer 617 (see FIG. 6).

Next, conventional deep trench processing techniques can be used to simultaneously form two adjacent deep trenches 601, 621 in the semiconductor substrate 602 (504). Specifically, conventional photolithographic techniques can be used to pattern the hard mask layer 618. The exposed portions of each layer 618-613 are selectively etched stopping at or just below the top surface 609 of the semiconductor substrate 602. Then, nitride sidewall spacers can be formed in the initial trench in order to protect the silicon layer 616, when the deep trenches 601, 621 are subsequently etched into the semiconductor substrate 602. Once the deep trenches 601, 621 are etched, the nitride sidewall spacers can be selectively removed. Thus, the resulting structure at this point in the formation process comprises two separate adjacent non-overlapping deep trenches 601, 621, where each trench extends vertically from the top surface 609 towards the bottom surface of the semiconductor substrate 602 (504, see FIG. 7).

Figure 7:
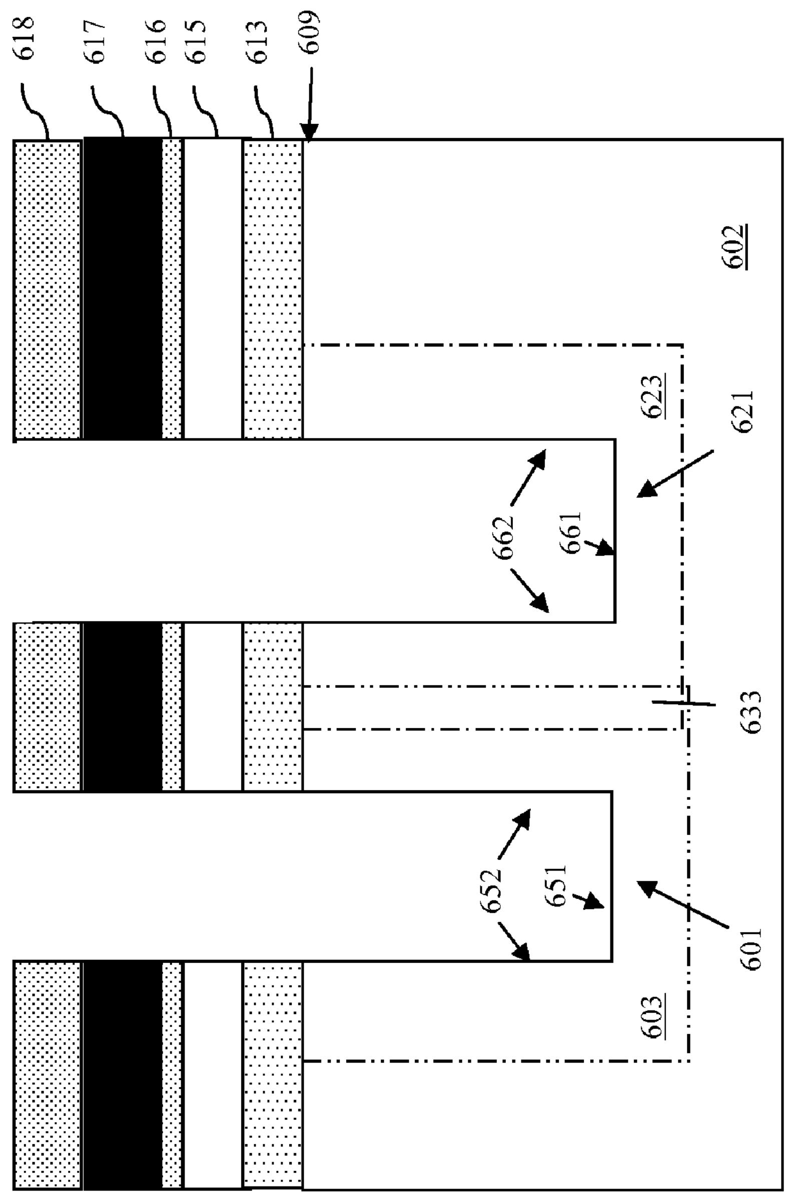
FIG. 7 is a cross-section view diagram illustrating a partially completed deep trench capacitor structure.
Figure 8:
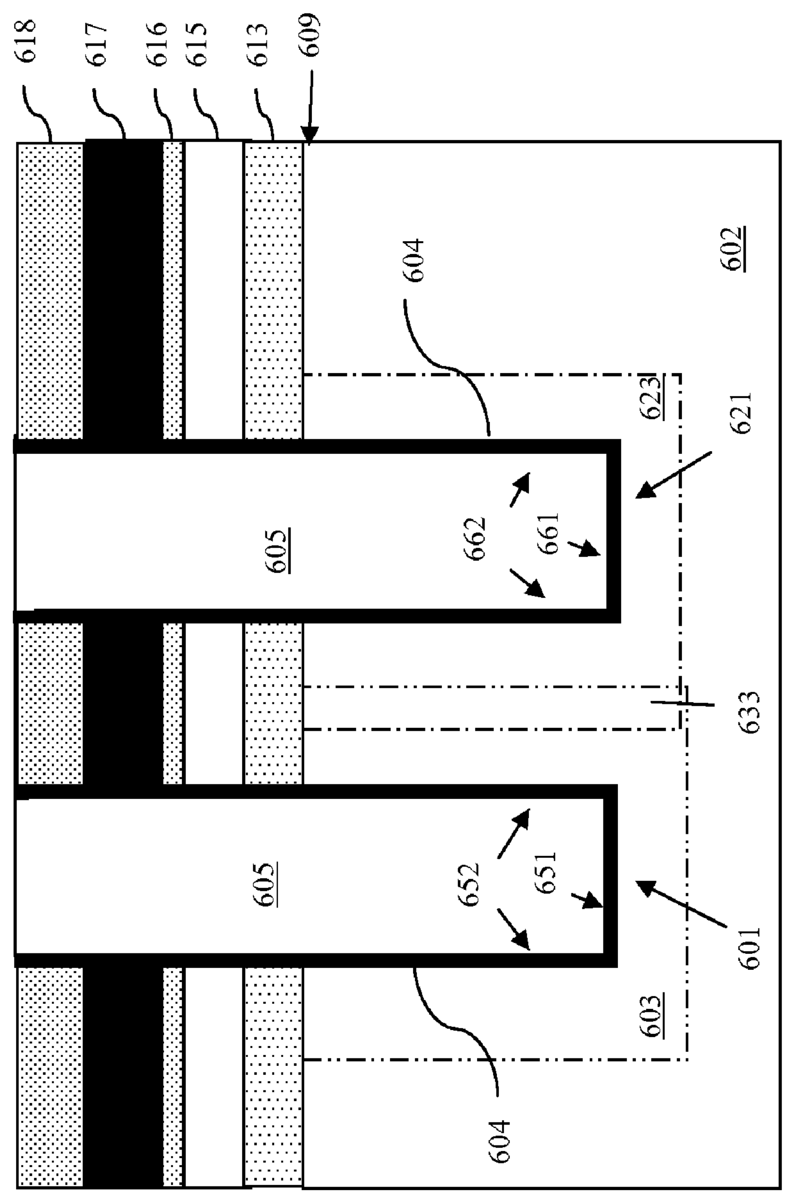
FIG. 8 is a cross-section view diagram illustrating a partially completed deep trench capacitor structure.

Once the deep trenches 601, 621 are formed, regions of the semiconductor substrate adjacent to each of the deep trenches can be heavily doped with the same type dopant such that these regions 603, 623 are conductive and such that they overlap (506, see FIG. 7). For example, each of these regions can be heavily doped with an N-type dopant, such as phosphorus (P), arsenic (As) and/or antimony (Sb)). Alternatively, each of these regions can be doped with a p-type dopant, such as boron (B), gallium (Ga), indium (In), and/or thallium (Tl). Any known or future developed technique can be used to accomplish this doping process, including but not limited to, gas phase doping, liquid phase doping, solid phase doping, plasma doping, ion implantation, plasma immersion ion implantation, cluster ion implantation, infusion doping, or any suitable combination of these techniques. Specifically, this doping process can be used to simultaneously form, in the semiconductor substrate 602, a first doped region 603 adjacent to the bottom surface 651 and sidewalls 652 of the first trench 601 (i.e., adjacent to the first bottom surface and first sidewalls) and a second doped region 623 adjacent the bottom surface 661 and sidewalls 662 of the second trench 621 (i.e., adjacent to the second bottom surface and second sidewalls). Furthermore, this process is performed such that the first doped region 603 and second doped region 623 contact each other (e.g., overlapping region 633).

Next, a dielectric liner 604 can be formed within the first trench adjacent to the bottom surface 651 and the sidewalls 652 (e.g., by depositing a thin conformal dielectric layer) and the trenches can be filled with a conductive fill material such that the conductive fill material in the second trench is in contact with the second doped region in the semiconductor substrate (508). In order to accomplish method step 508, the following process steps can be performed.

Figure 9:
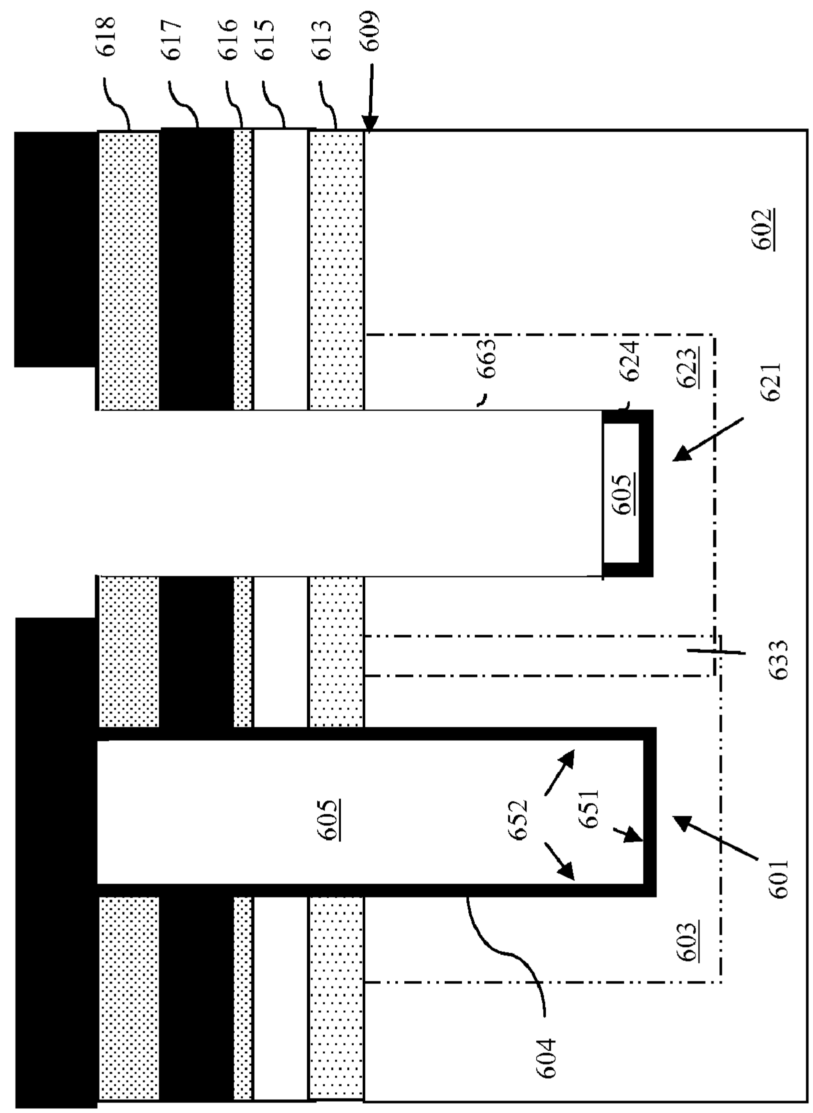
FIG. 9 is a cross-section view diagram illustrating a partially completed deep trench capacitor structure.
Figure 10:
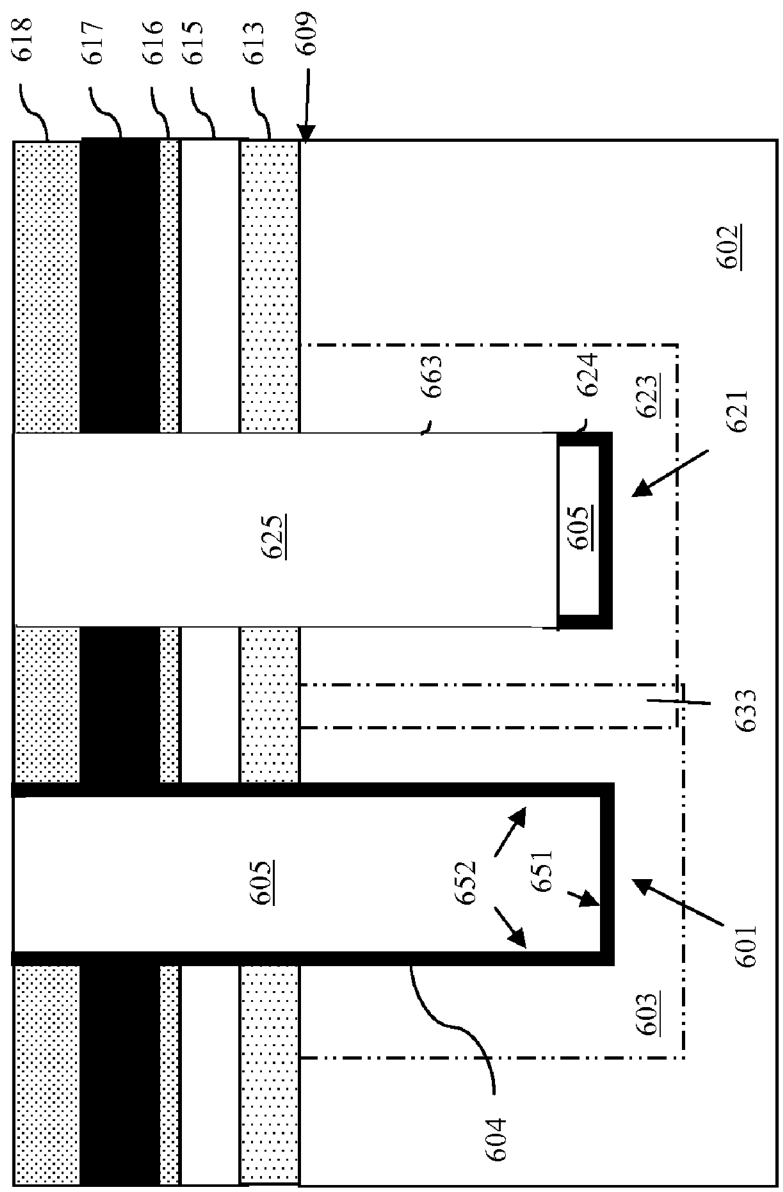
FIG. 10 is a cross-section view diagram illustrating a partially completed deep trench capacitor structure.

After the first and second doped regions 602, 623 are formed in the semiconductor substrate 602, a thin conformal dielectric layer 604 (e.g., a silicon oxide layer, silicon nitride layer, silicon oxynitride layer, high-k dielectric material layer, or any combination thereof) is deposited across the structure such that it covers the bottom surface 651 and sidewalls 652 of the first trench 601 as well as the bottom surface 661 and sidewalls 662 of the second trench 621 (510). Then, a blanket layer of a conductive fill material 605 can be deposited (512). The conductive fill material 605 can comprise a polycrystalline or amorphous silicon, germanium or silicon germanium heavily doped with the same type dopant as the doped regions 603 and 623 in the substrate 602 (see discussion above). Alternatively, the conductive fill material 605 can comprise a metal (e.g., tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), or any suitable combination of these materials. A chemical mechanical polishing (CMP) technique is then performed, stopping at the top of the trenches 601, 621 (i.e., at the hard mask layer 618) (514, see FIG. 8). Once both trenches 601, 621 are filled with the conductive material 605, the first trench 601 can be masked and the conductive fill material 605 as well as the thin conformal dielectric layer 604 in the second trench 621 can be recessed so as to expose at least an upper section 663 of the second trench 621 in the second doped region 623 of the substrate (518, see FIG. 9). Optionally, all of the conductive fill material 605 and dielectric layer 604 can be removed from the second trench 621. Alternatively, a portion 624 of the dielectric layer 604 and a portion of the conductive fill material 605 can remain in the lower section of the second trench 621, as illustrated in FIG. 9. Next, the mask over the first trench 601 can be removed, a conductive fill material 625 can be deposited, and another CMP process can be performed, stopping again on the hard mask layer 618 (520-522, see FIG. 10). The conductive fill material 625 can be the same material as the conductive fill material 605 deposited into the first trench at process 512, discussed above). Thus, the conductive fill material 625 in the upper section 663 of the second trench 621 is in direct contact with the second doped region 623 of the semiconductor substrate 602.

Once the trenches 601, 621 are filled with the conductive fill material 605, 625, conventional processing techniques can be used to form contacts (524). That is, first and second contacts can simultaneously be formed to the conductive fill material 605, 625 in the first and second trenches 601, 621, respectively.

Figure 11:
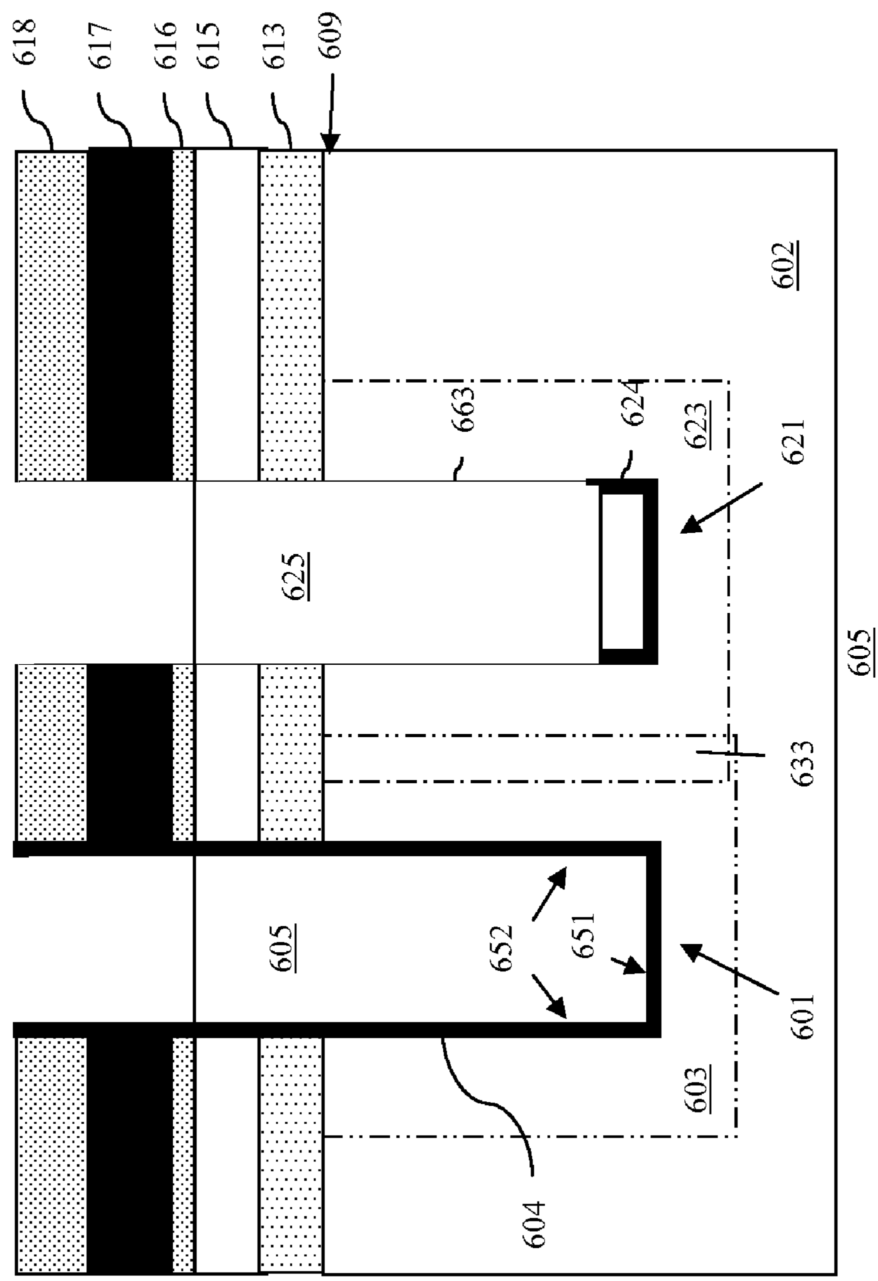
FIG. 11 is a cross-section view diagram illustrating a partially completed deep trench capacitor structure.
Figure 12:
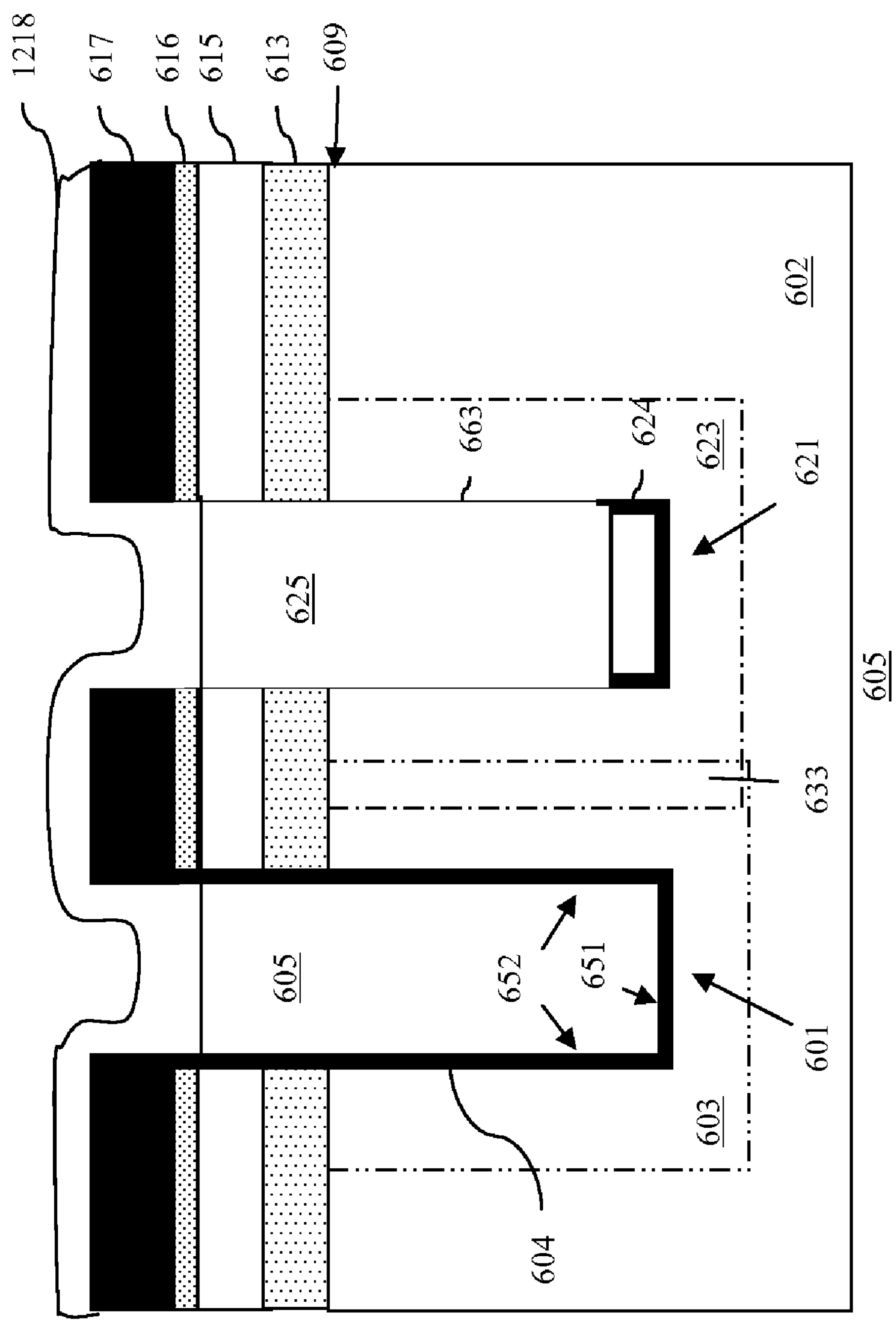
FIG. 12 is a cross-section view diagram illustrating a partially completed deep trench capacitor structure.
Figure 13:
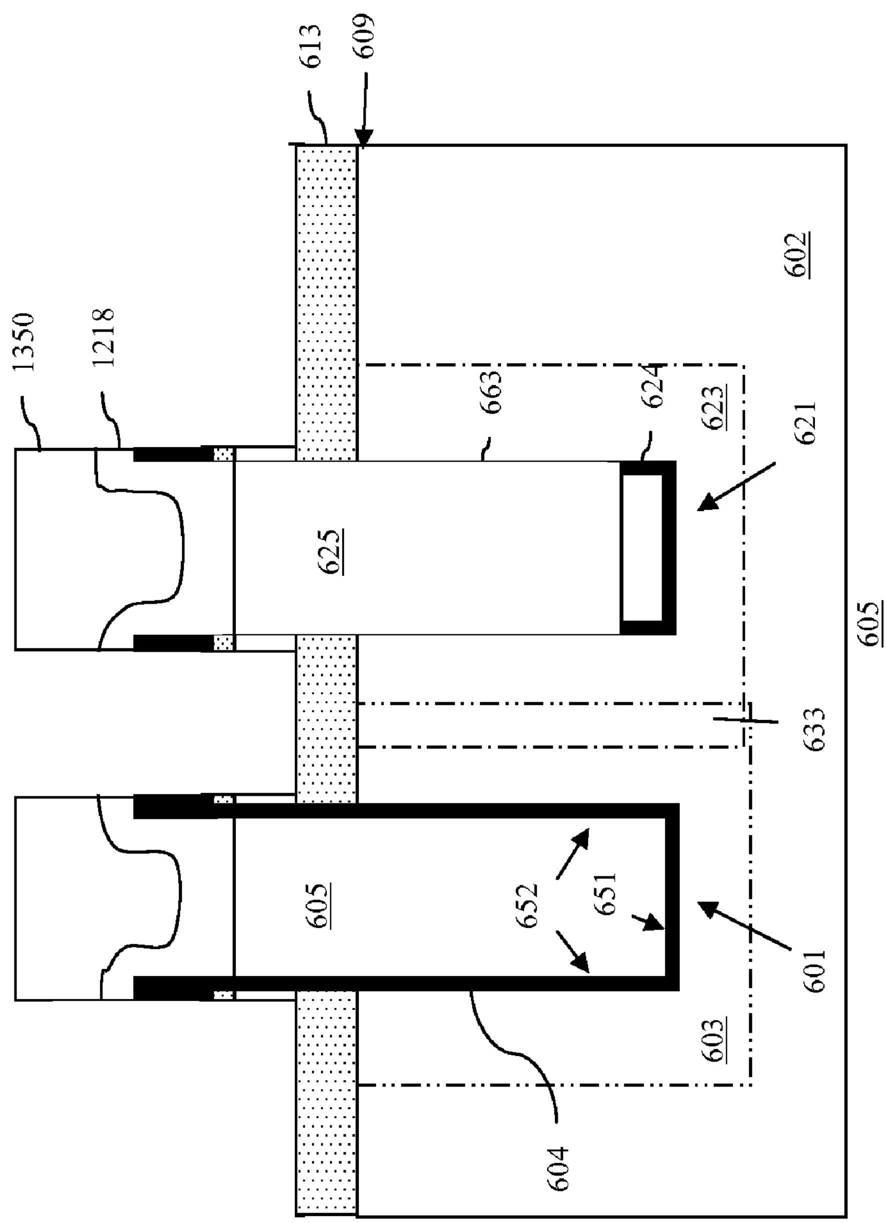
FIG. 13 is a cross-section view diagram illustrating a partially completed deep trench capacitor structure.
Figure 14:
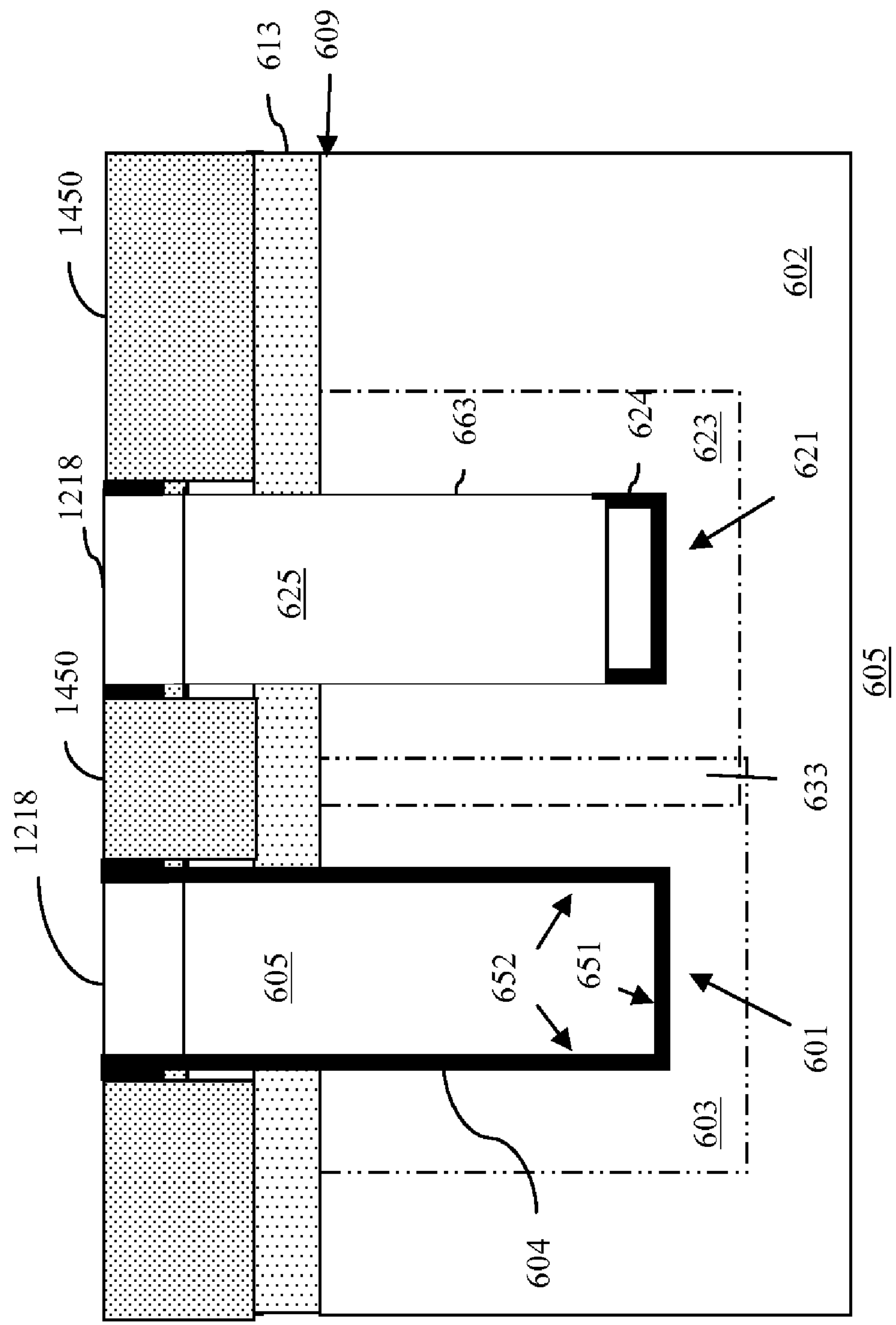
FIG. 14 is a cross-section view diagram illustrating a partially completed deep trench capacitor structure.
Figure 15:
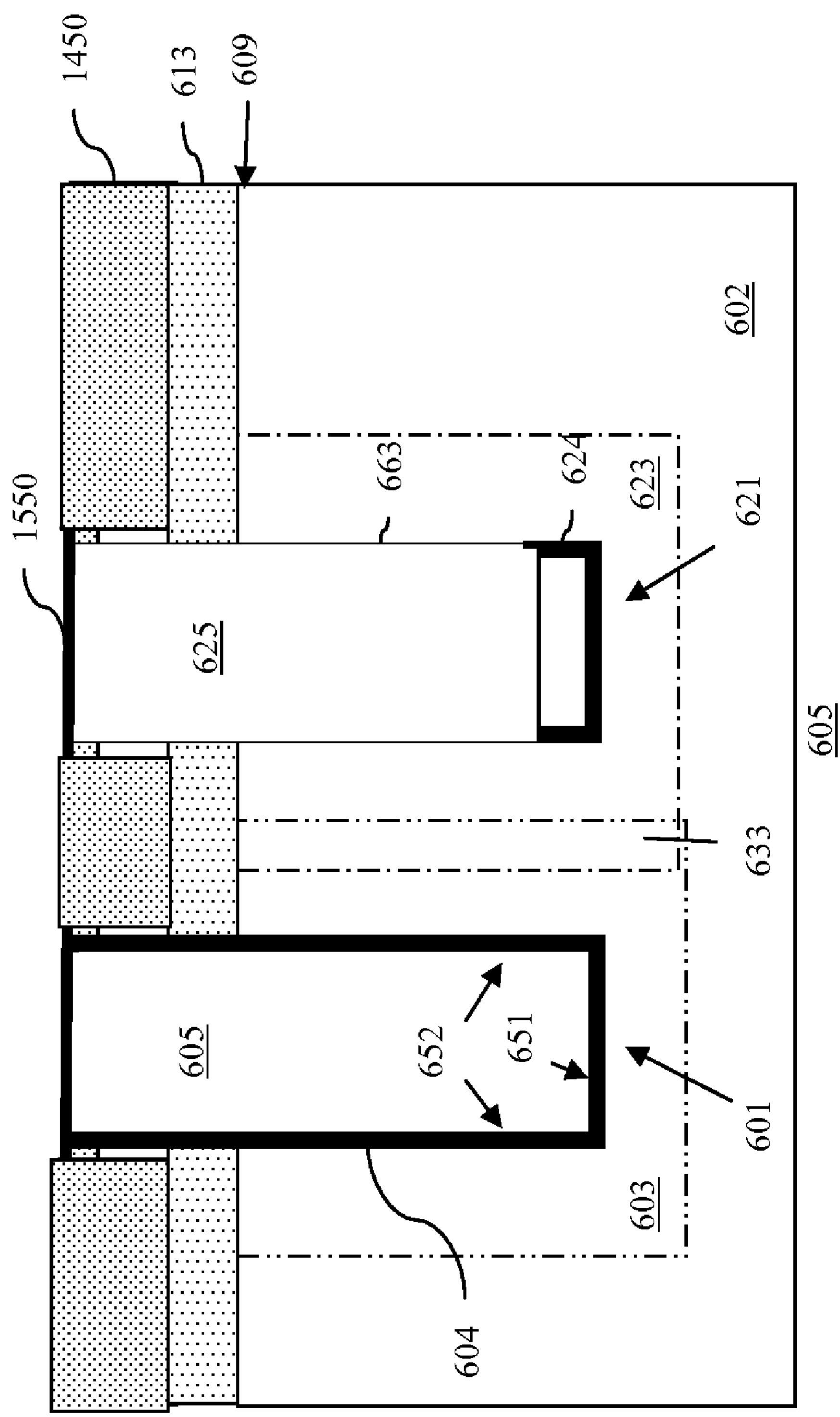
FIG. 15 is a cross-section view diagram illustrating a partially completed deep trench capacitor structure.

For example, if the wafer being used in a silicon-on-insulator (SOI) wafer, the conductive fill material 605, 625 in each of the trenches 601, 621 can be recessed to the level of the silicon layer 615 (see FIG. 11). Next, the hard mask oxide layer 618 can be stripped and another hard mask oxide layer 1218 is deposited (see FIG. 12). This can be followed by deposition and patterning of a polysilicon hard mask 1350 over each of the trenches 601, 621 the selectively etching back the portions of the hard mask layer 1218, nitride layer 617, pad oxide layer 616 and silicon layer 615 that are not protected by the mask 1350 (see FIG. 13). Next, a fill oxide layer (e.g., a silicon dioxide ($SiO_2$) layer) can be deposited (e.g., by high density plasma (HDP) chemical vapor deposition and HDP anneal) and planarized so as to form shallow trench isolation regions 1450 (see FIG. 14). Additional processing can include, an ozone cleaning process, a DHF deglaze process and a nitride layer 617 stripping process (e.g., by hot phosphorous) such that the top surface of the conductive fill material 605, 625 is exposed. If the conductive fill material 605, 625 comprises polycrystalline or amorphous silicon, conventional silicidation process can optionally be performed in order to form a metal silicide layer (e.g., a nickel or cobalt silicide layer 1550 on the exposed top surface of fill material 605, 625. Next, referring to FIG. 16, one or more inter-layer dielectrics (ILD) 1650 can be deposited, patterned and etched with contact holes aligned above the trenches 601, 621. The contact holes can be lined with a conductive liner (e.g., with titanium (Ti), titanium nitride (TiNi), etc.) and filled with a conductive fill material (e.g., with tungsten (W)), thereby, forming the first contact 606 to the first trench 606 and the second contact 611 to the second trench 621.

Figure 16:
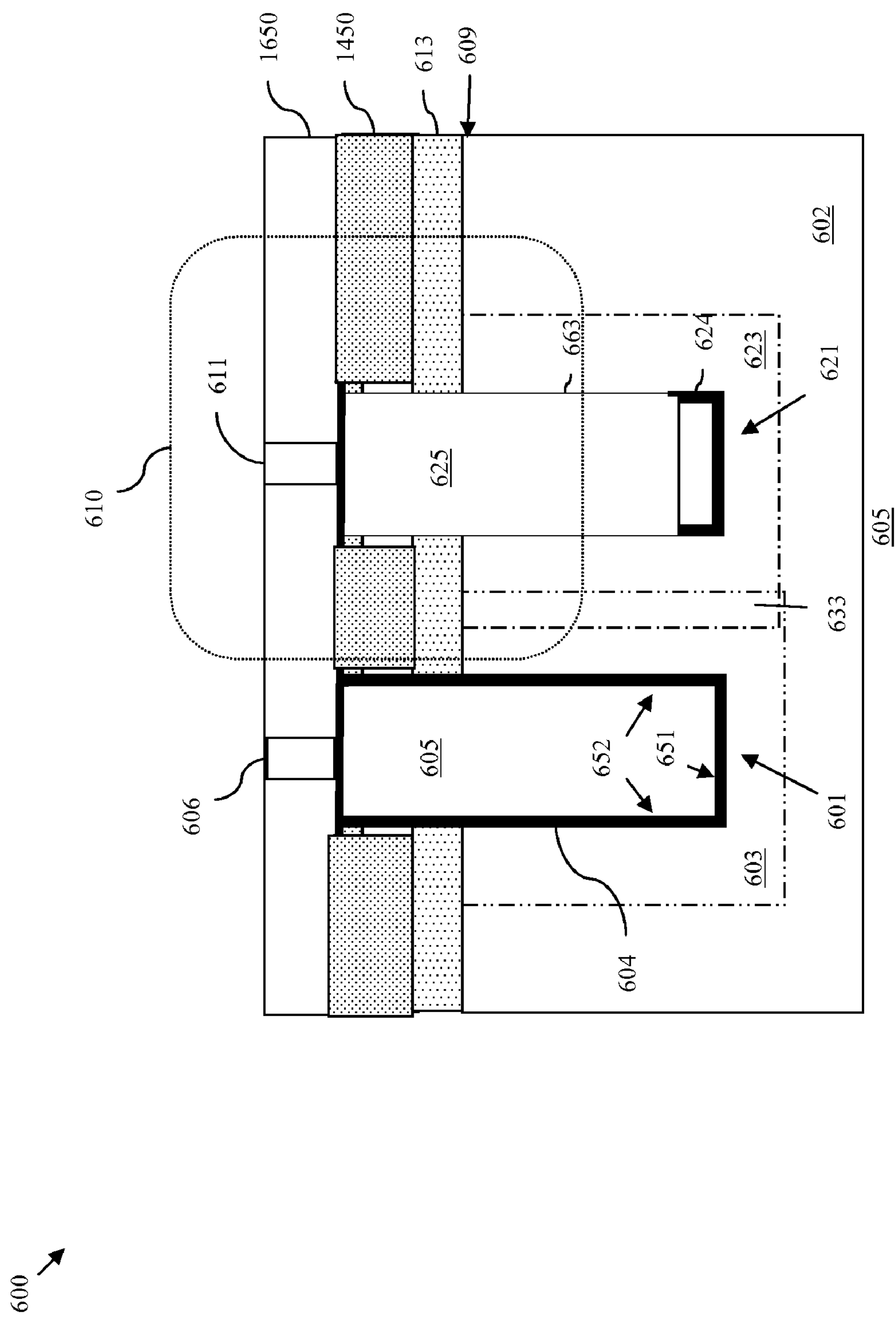
FIG. 16 is a cross-section view diagram illustrating a partially completed deep trench capacitor structure.

In the resulting deep trench capacitor structure 600 of FIG. 16, the first doped region 603 adjacent to (i.e., bordering) the first trench 601 functions as the buried capacitor plate, the dielectric liner 604 lining the first trench 601 functions as the capacitor dielectric and the conductive fill material 605 in the first trench 601 functions as another capacitor plate. Thus, the first contact 606 directly contacts the capacitor plate (i.e., conductive material 605) within the first trench 601 and the second doped region 623 as well as the conductive fill material 625 in the second trench 621 in contact with that second doped region 623 provides the electrical connection between the second contact 611 and the buried capacitor plate (i.e., the first doped region 603. Consequently, the deep trench capacitor 600 that is formed using this method includes a unique deep trench buried capacitor plate contact 610 comprising the second contact 611, the conductive fill material 625 in the second trench 621 and the second doped region 623 within the semiconductor substrate 602.

Also disclosed are embodiments of another integrated circuit structure and, more specifically, a memory cell (e.g., a static random access memory (SRAM) cell) that incorporates the above-described deep trench capacitor structure (see DT capacitor 300 of FIG. 3 or 400 of FIG. 4) including the deep trench buried capacitor plate contact 310, 410. As discussed above, soft errors can be eliminated or at least minimized by adding capacitance to the memory cell structure. Specifically, referring to the schematic and box diagrams of FIGS. 17 and 18 in combination, the memory cell structure 1700 comprises a semiconductor substrate 1702 (e.g., a silicon substrate of a silicon-on-insulator (SOI) wafer, a semiconductor substrate of a bulk semiconductor wafer, a silicon substrate of a bulk silicon wafer, etc.). The memory cell structure 1700 further comprises a pair 1790 of inverter circuits either within the semiconductor substrate 1702 (e.g., within a bulk silicon substrate) or above the substrate 1702 (e.g., within a silicon layer on a buried oxide (BOX) layer of an SOI wafer). The pair 1790 of inverter circuits can be electrically connected by cross-coupled connection 1791.

More specifically, as with a conventional SRAM cell, the memory cell of the present invention can comprise a P-semiconductor substrate 1702 (or, alternatively, a portion of the substrate can comprise a P-type diffusion region (e.g., a PWELL)). An adjacent portion of the substrate 1702 can comprise an N-type diffusion region (e.g., an NWELL 1780). Each inverter circuit in the pair 1790 can comprise a pull-up PFET 1792 formed in the NWELL 1780 connected in series with a common gate connection to a pull-down NFET 1793 formed in the P-portion of the substrate 1702. The common gate connection in each inverter circuit is cross-connected to the common gate connection of the other inverter circuit (see cross-coupled connection 1791), thus, forming the storage nodes of the memory cell 1700. Each of the inverter circuits is also connected in series with a corresponding pass-gate NFET 1794, having a common gate connection to a word line WL and a source connection to a different bit line (BL1 or BL2). This configuration allows selection of the memory cell 1700 via the word line for reading or writing over the bit lines.

Additionally, the memory cell 1700 of the present invention comprises at least one deep trench capacitor 300, 400 (see detailed discussion above of DT capacitor 300 of FIG. 3 or 400 of FIG. 4) positioned within the semiconductor substrate 1702. The second contact 311, 411 and, more specifically, the deep trench buried capacitor plate contact 310, 410, which comprises the second contact 311, 411, the conductor 325, 425 filled trench, and doped region 323, 423, provides the electrical connection between the buried capacitor plate 303, 403 of the capacitor 300, 400 and the cross-coupled connection 1791 (i.e., the storage nodes) of the memory cell 1700.

As discussed U.S. Pat. No. 6,507,511 (incorporated by reference above), connecting deep trench capacitor(s) to the storage node(s) of an SRAM cell increases $Q_{crit}$ and eliminates soft errors. Soft errors occur due the movement of alpha particles, which can introduce a charge into a memory cell circuit. Such a charge can cause the logic state of the cell to inadvertently change. Added capacitance to the storage nodes of memory cells reduces their susceptibility to soft errors, by providing increased stability (i.e., by increasing the charge required for the logic state of the memory cell to change). However, the unique configuration of the deep trench capacitor 300, 400 of the present invention allows for greater SRAM design flexibility because it eliminates the need to form the deep trench capacitor through an N-doped diffusion region connector (i.e., an NWELL or an NBAND). Eliminating the need for an NWELL or NBAND allows SRAM cell 1700 designers to reduce the device size and/or optimize the circuit layout.

Figure 17:
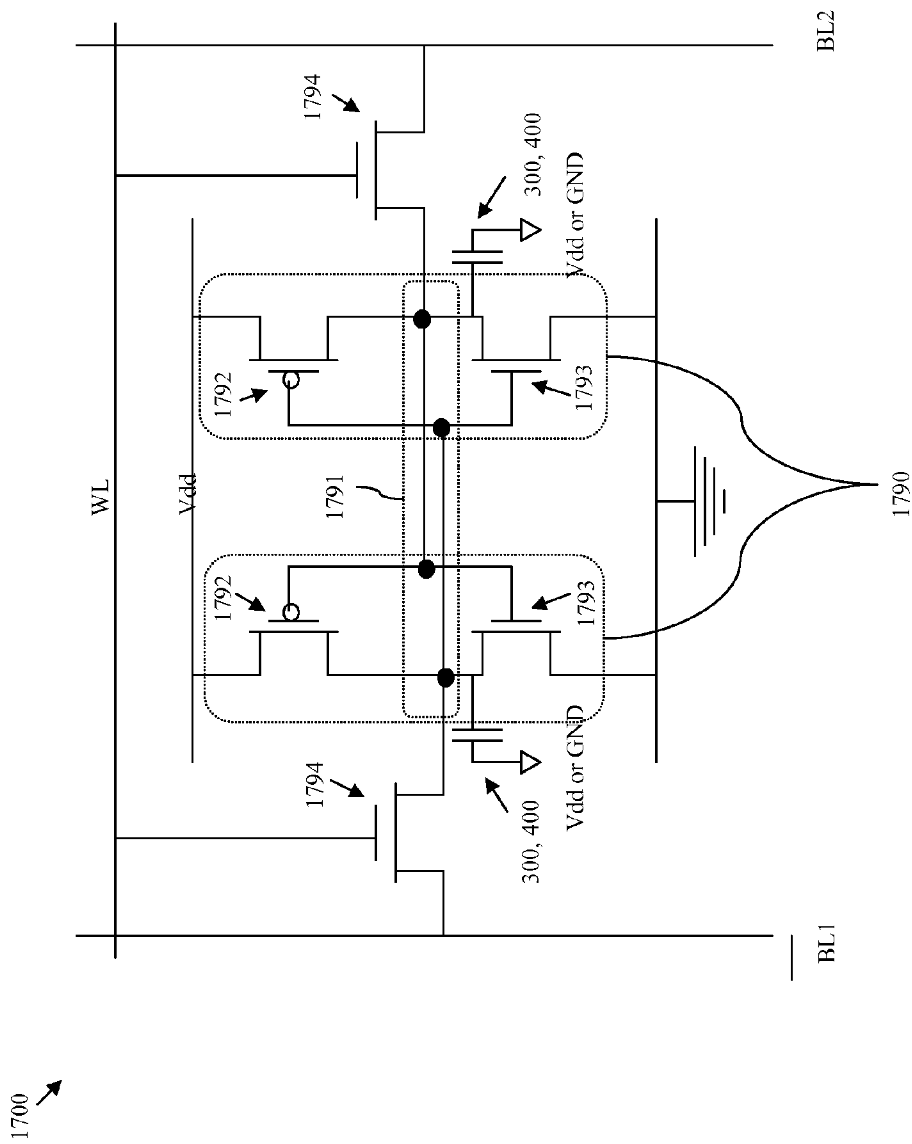
FIG. 17 is schematic diagram illustrating an embodiment of a static random access memory cell incorporating the deep trench capacitor of FIGS. 3 or 4.
Figure 18:
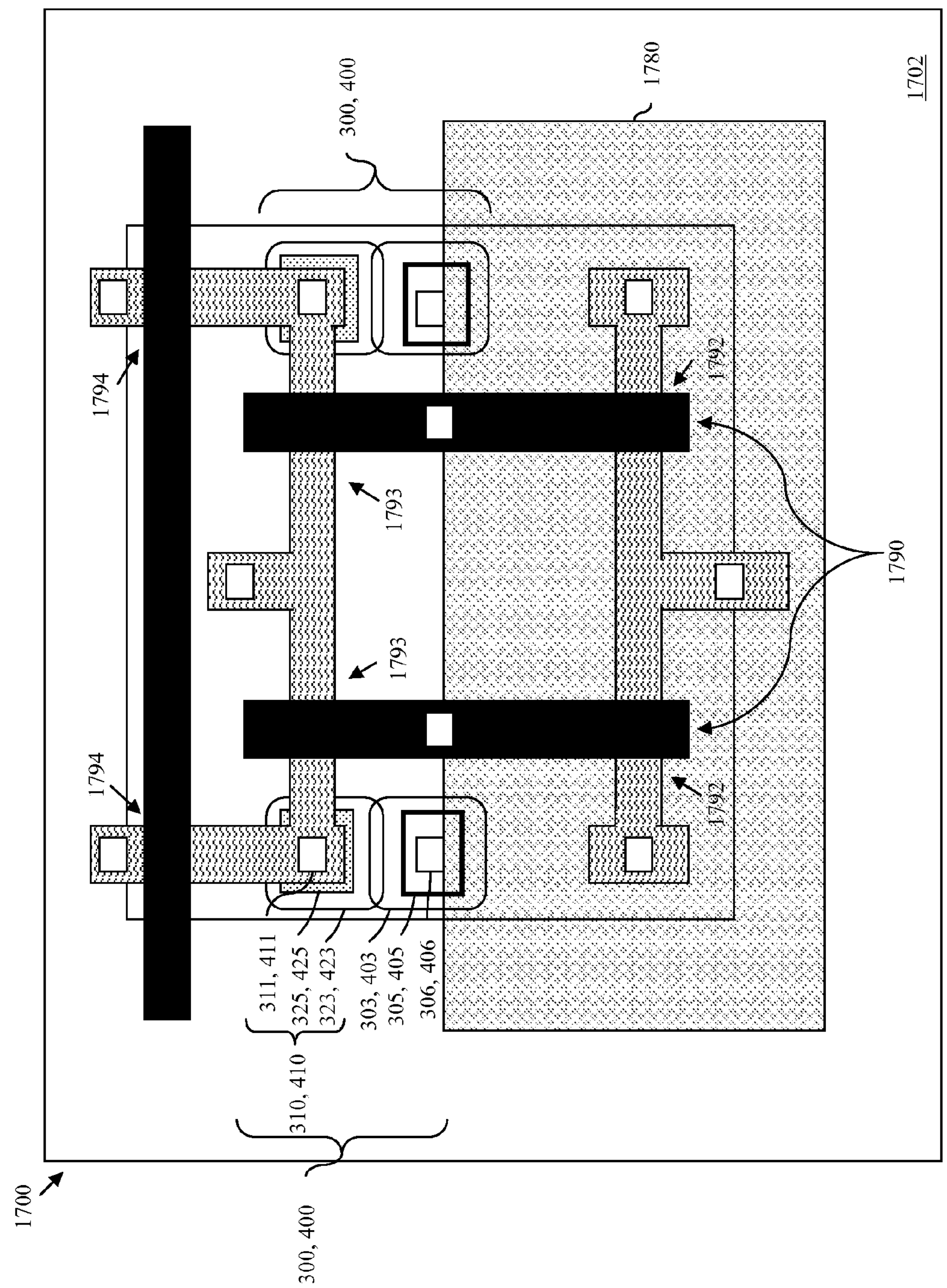
FIG. 18 is top view diagram illustrating the static random access memory cell of FIG. 17.
Figure 19:
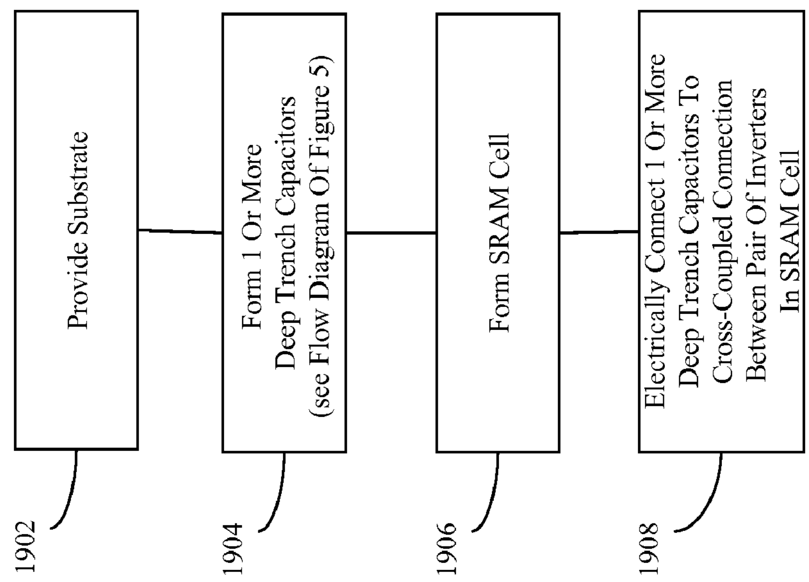
FIG. 19 is a flow diagram illustrating an embodiment of a method of forming the memory cell of FIGS. 17 and 18.

Referring to FIG. 19, also disclosed are embodiments of a method of forming the above-described memory cell structure 1700 of FIGS. 17-18. The method of forming the memory cell structure 1700 first comprises first providing a semiconductor substrate (e.g., the silicon substrate of a silicon-on-insulator (SOI) wafer, the semiconductor substrate of a bulk semiconductor wafer, the silicon substrate of a bulk silicon wafer, etc.) (1902). One or more deep trench capacitors, each having a deep trench buried capacitor plate are formed within the semiconductor substrate (1904, see FIG. 5 and detailed discussion above regarding the method steps for forming such a deep trench capacitor). Additionally, using conventional processing techniques, a memory cell structure (e.g., a static random access memory (SRAM) memory cell structure) that comprises at least a pair of cross-coupled inverter circuits 1790 is formed in and/or above the substrate (1906). For example, the active silicon portions of the SRAM cell 1700 can be formed within the substrate of a bulk semiconductor wafer adjacent to the deep trench capacitor. Alternatively, the active silicon portions of the SRAM cell 1700 can be formed above the semiconductor substrate in the silicon layer of a silicon-on-insulator (SOI) wafer. The deep trench capacitor(s) are electrically connected to the cross-coupled connection 1791 between the pair of inverter circuits 1790 (i.e., the storage nodes) by the second contact and, more particularly, by the deep trench buried capacitor plate contact (1908).

Therefore, disclosed above are embodiments of a deep trench capacitor structure and a method of forming the structure that incorporates a buried capacitor plate contact that is simultaneously formed using an adjacent deep trench. This configuration eliminates the need for additional photolithographic processing, thereby optimizing process windows. The disclosed configuration also eliminates the need to form the deep trench capacitor through an N-doped diffusion region connector and, thereby, allows for greater design flexibility when connecting the deep trench capacitor to another integrated circuit structure (e.g., to a memory cell or decoupling capacitor array). Also, disclosed herein are embodiments of another integrated circuit structure and method and, more specifically, a memory cell (e.g., a static random access memory (SRAM) cell)) structure and method that incorporates one or more of these deep trench capacitors in order to minimize or eliminate soft errors.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. A method of forming a capacitor structure, said method comprising:

providing a semiconductor substrate;

forming, in said semiconductor substrate, a first trench and a second trench adjacent to said first trench;

forming, in said semiconductor substrate, a first doped region adjacent to a first bottom surface and first sidewalls of said first trench and a second doped region in contact with said first doped region and adjacent to a second bottom surface and second sidewalls of said second trench;

forming a dielectric liner lining said first trench adjacent to said first bottom surface and said first sidewalls; and filling said first trench and said second trench with a conductive fill material such that said conductive fill material in said first trench is physically and electrically separated from said first doped region by said dielectric liner lining said first trench and further such that said conductive fill material in said second trench is physically and electrically connected to said second doped region and, through said second doped region, electrically connected to said first doped region;

said forming of said dielectric liner and said filling of said first trench and said second trench with said conductive fill material comprising:

after said forming of said first doped region and said second doped region, depositing a thin conformal dielectric layer onto said first bottom surface and said first sidewalls of said first trench and onto said second bottom surface and said second sidewalls of said second trench;

depositing a first layer of said conductive fill material so as to fill said first trench and said second trench with said conductive fill material;

recessing said first layer of said conductive fill material and said thin conformal dielectric layer in said second trench without recessing said first layer of said conductive fill material and said thin conformal dielectric layer in said first trench so as to expose at least an upper section of said second trench; and depositing a second layer of said conductive fill material so as to refill said second trench such that said second layer of said conductive fill material in said upper section of said second trench is in contact with said second doped region.

2. The method of claim 1, said filling of said first trench and said second trench comprising depositing a doped polysilicon fill material into said first trench and said second trench.

3. The method of claim 1, further comprising forming a first contact to said first layer of said conductive fill material in said first trench and a second contact to said second layer of said conductive fill material in said second trench.

4. The method of claim 3, wherein said dielectric liner lines said first trench being a capacitor dielectric of said capacitor structure, said first layer of said conductive fill material in said first trench being a first capacitor plate of said capacitor structure, said first doped region adjacent to said first trench being a buried second capacitor plate of said capacitor structure, and said second layer of said conductive fill material in said second trench being in contact with said second doped region and providing an electrical connection between said second contact and said buried second capacitor plate.

5. A method of forming a capacitor structure, said method comprising:

providing a semiconductor substrate;

forming, in said semiconductor substrate, a first trench and a second trench adjacent to said first trench;

forming, in said semiconductor substrate, a first doped region adjacent to a first bottom surface and first sidewalls of said first trench and a second doped region in contact with said first doped region and adjacent to a second bottom surface and second sidewalls of said second trench;

forming a dielectric liner lining said first trench adjacent to said first bottom surface and said first sidewalls; and filling said first trench and said second trench with a conductive fill material such that said conductive fill material in said second trench is in contact with said second doped region, said forming of said dielectric liner and said filling of said first trench and said second trench with said conductive fill material comprising:

after said forming of said first doped region and said second doped region, depositing a thin conformal dielectric layer onto said first bottom surface and said first sidewalls of said first trench and onto said second bottom surface and said second sidewalls of said second trench;

depositing a first layer of said conductive fill material so as to fill said first trench and said second trench with said conductive fill material;

recessing said first layer of said conductive fill material and said thin conformal dielectric layer in said second trench so as to expose at least an upper section of said second trench; and depositing a second layer of said conductive fill material so as to refill said second trench such that said second layer of said conductive fill material in said upper section of said second trench is in contact with said second doped region.

6. The method of claim 5, wherein said first layer of said conductive fill material and said second layer of said conductive fill material comprising a doped polysilicon fill material.

7. The method of claim 5, further comprising, after said depositing of said second layer of said conductive fill material, forming a first contact to said first layer of said second conductive fill material in said first trench and a second contact to said second layer of said conductive fill material in said second trench.

8. The method of claim 7, wherein said dielectric liner lines said first trench being a capacitor dielectric of said capacitor structure, said first layer of said conductive fill material in said first trench being a first capacitor plate of said capacitor structure, said first doped region adjacent to said first trench being a buried second capacitor plate of said capacitor structure, and said second layer of said conductive fill material in said second trench being in contact with said second doped region and providing an electrical connection between said second contact and said buried second capacitor plate.

9. A method of forming a capacitor structure, said method comprising:

providing a semiconductor substrate;

forming, in said semiconductor substrate, a first trench and a second trench adjacent to said first trench;

forming, in said semiconductor substrate, a first doped region adjacent to a first bottom surface and first sidewalls of said first trench and a second doped region in contact with said first doped region and adjacent to a second bottom surface and second sidewalls of said second trench;

forming a dielectric liner lining said first trench adjacent to said first bottom surface and said first sidewalls; and filling said first trench and said second trench with a conductive fill material such that said conductive fill material in said first trench is physically and electrically separated from said first doped region by said dielectric liner lining said first trench and further such that said conductive fill material in an upper section of said second trench adjacent to a top surface of said semiconductor substrate is physically and electrically connected to said second doped region and, through said second doped region, electrically connected to said first doped region;

said filling of said first trench and said second trench comprising:

after said forming of said first doped region and said second doped region, depositing a thin conformal dielectric layer onto said first bottom surface and said first sidewalls of said first trench and onto said second bottom surface and said second sidewalls of said second trench;

depositing a first layer of said conductive fill material so as to fill said first trench and said second trench with said conductive fill material;

recessing said first layer of said conductive fill material and said thin conformal dielectric layer in said second trench without recessing said first layer of said conductive fill material and said thin conformal dielectric layer in said first trench so as to expose at least said upper section of said second trench; and depositing a second layer of said conductive fill material so as to refill said second trench such that said second layer of said conductive fill material in said upper section of said second trench is in contact with said second doped region.

10. The method of claim 9,wherein said first layer of said conductive fill material and said second layer of said conductive fill material comprising a doped polysilicon fill material.

11. The method of claim 9, further comprising forming a first contact to said first layer of said conductive fill material in said first trench and a second contact to said second layer of said conductive fill material in said second trench.

12. The method of claim 11, wherein, said dielectric layer lining said first trench being a capacitor dielectric of said capacitor structure, said first layer of said conductive fill material in said first trench being a first capacitor plate of said capacitor structure, said first doped region adjacent to said first trench being a buried second capacitor plate of said capacitor structure, and said second layer of said conductive fill material in said second trench being in contact with said second doped region and providing an electrical connection between said second contact and said buried second capacitor plate.

* * * * *